(12) United States Patent
Song et al.

(10) Patent No.: US 10,890,789 B2
(45) Date of Patent: Jan. 12, 2021

(54) MASK AND MANUFACTURING METHOD THEREOF AS WELL AS DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Ping Song, Beijing (CN); Hongmin Li, Beijing (CN); Zhifu Dong, Beijing (CN); Wei Xue, Beijing (CN); Liqing Liao, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 345 days.

(21) Appl. No.: 15/771,278

(22) PCT Filed: Sep. 30, 2017

(86) PCT No.: PCT/CN2017/104765
§ 371 (c)(1),
(2) Date: Apr. 26, 2018

(87) PCT Pub. No.: WO2018/176783
PCT Pub. Date: Oct. 4, 2018

(65) Prior Publication Data
US 2020/0225513 A1  Jul. 16, 2020

(30) Foreign Application Priority Data
Mar. 30, 2017  (CN) .......................... 2017 1 0200644

(51) Int. Cl.
*G03F 1/38* (2012.01)
*G02F 1/13* (2006.01)
*G02F 1/1339* (2006.01)

(52) U.S. Cl.
CPC ........ *G02F 1/1303* (2013.01); *G02F 1/13394* (2013.01); *G03F 1/38* (2013.01); *G02F 2001/13398* (2013.01)

(58) Field of Classification Search
CPC .............. G02F 1/1303; G02F 1/13394; G02F 2001/13398; G03F 2/38; G03F 1/54; G03F 1/50; G03F 1/60; G03F 1/38
(Continued)

(56) References Cited

U.S. PATENT DOCUMENTS

2006/0076677 A1    4/2006   Daubenspeck et al.

FOREIGN PATENT DOCUMENTS

CN    101373323 A    2/2009
CN    102314074 B    4/2013
(Continued)

OTHER PUBLICATIONS

Computer-generated translation of JP 09-090608 (Apr. 1997). (Year: 1997).*
(Continued)

*Primary Examiner* — John A McPherson
(74) *Attorney, Agent, or Firm* — Dinsmore & Shohl LLP

(57) ABSTRACT

The present disclosure relates to a mask and a manufacturing method thereof as well as a display device, the mask includes a transmittable substrate and a mask pattern formed on the transmittable substrate, wherein a transmittance of the transmittable substrate decreases gradually from the edge to the center.

13 Claims, 2 Drawing Sheets

(58) Field of Classification Search
USPC .............................................. 430/5; 349/156
See application file for complete search history.

(56) References Cited

FOREIGN PATENT DOCUMENTS

| | | | |
|---|---|---|---|
| CN | 103135334 | A | 6/2013 |
| CN | 104280942 | A | 1/2015 |
| CN | 104698739 | A | 6/2015 |
| CN | 105807503 | A | 7/2016 |
| CN | 106502044 | A | 3/2017 |
| CN | 106909023 | A | 6/2017 |
| JP | 09-090608 | A * | 4/1997 |
| JP | 5211643 | B2 | 5/2009 |

OTHER PUBLICATIONS

Second Office Action for CN Appl. No. 201710200644.9, dated Aug. 30, 2019.
First Office Action for CN Appl. No. 201710200644.9, dated Mar. 4, 2019, 12 pages with translation.
International Search Report and Written Opinion for International Appl. No. PCT/CN2017/104765, dated Jan. 9, 2018.

* cited by examiner

MASK AND MANUFACTURING METHOD THEREOF AS WELL AS DISPLAY DEVICE

CROSS-REFERENCE TO RELATED APPLICATIONS

The present application claims priority under 35 U.S.C. § 371 to International Patent Application No. PCT/CN2017/104765 filed on Sep. 30, 2017, which claims priority to Chinese Patent Application No. 201710200644.9 filed on Mar. 30, 2017, the disclosure of each of which is incorporated herein by reference in its entirety.

TECHNICAL FIELD

The present disclosure relates to a mask and a manufacturing method thereof as well as a display device.

BACKGROUND

With the development of the liquid crystal display technology, big size, high quality, low cost become the future development direction. At present, with the demand for big size, manufacturing of Thin Film Transistor Liquid Crystal Display (TFT-LCD) develops towards higher generations continually.

A TFT-LCD panel is mainly formed by the aligned assembly of a color film substrate and an array substrate. Photo Spacers (abbreviated as PS) isolate gaps, in which liquid crystal is injected, between the two substrates. PSs are usually obtained by performing exposure on a photoresist layer deposited on the color film substrate using a mask and then performing development on the photoresist layer. The mask is a component for patterning in a photolithographic process of the TFT-LCD. The mask mainly includes a transparent substrate and an opaque region with a specific pattern formed on the transparent substrate. Usually, when manufacturing the mask, an opaque film layer (e.g. a chromium layer) is mainly deposited on the transparent substrate, then a specific pattern is made on the opaque film layer.

In the cell assembly process of the TFT_LCD, the PS height uniformity is a very critical parameter which influences optical characteristics of the product. The better the PS height uniformity is, the lower the change in the liquid crystal dropping amount is, the larger the margin (the fluctuation range) of the liquid crystal filling amount is, so that the thickness of the box can be controlled better. Meanwhile, in an aspect of reliability evaluation, it may be ensured that optical and relevant characteristics of all panels (liquid crystal panels) on the glass substrate are uniform, there is no difference in orientation of the glass surface, and the passed yield is improved. In the relevant art, when the proximity exposure is adopted, PS heights obtained by the exposure are not uniform, which causes decrease in the process margin of the liquid crystal dropping amount. As a result, this results in bad reliance problems of high temperature yellowing, adsorption yellowing, too many bubbles, etc.

SUMMARY

According to some embodiments of the present disclosure, there is provided a mask which comprises a transmittable substrate and a mask pattern formed on the transmittable substrate, wherein a transmittance of the transmittable substrate decreases gradually from an edge to a center.

In some embodiments of the present disclosure, the transmittable substrate comprises a transparent substrate with a uniform transmittance and a compensation layer coated on the transparent substrate, a transmittance of the compensation layer decreases gradually from the edge to the center, and the mask pattern is formed at one side of the transparent substrate, the compensation layer is coated on the other side of the transparent substrate.

In some embodiments of the present disclosure, the transmittance decreasing gradually from the edge to the center is decreasing gradually from 100% to 70%.

In some embodiments of the present disclosure, when the transmittance decreases gradually from the edge to the center, a magnitude of gradual decrease is adjusted according to a magnitude of change of an exposure gap between the mask and an exposure machine worktable from the edge to the center.

In some embodiments of the present disclosure, the compensation layer comprises at least one of polypropylene, polyethylene, polyvinyl chloride, or polyethylene terephthalate.

In some embodiments of the present disclosure, the compensation layer comprises a 1st region to a Nth region from the edge to the center, and an ith region surrounds an (i+1)th region, a transmittance of the ith region is higher than that of the (i+1)th region, a transmittance within each region is uniform, i=1, . . . , N−1, N is a natural number and N>1. In some embodiments of the present disclosure, materials of the 1st region to the Nth region are the same, and a thickness of the ith region is smaller than that of the (i+1)th region. In some other embodiments, a different color is painted in each of the 1st region to the Nth region.

In some embodiments of the present disclosure, the transmittable substrate comprises a 1st region to a Nth region from the edge to the center, and an ith region surrounds an (i+1)th region, a transmittance of the ith region is higher than that of the (i+1)th region, a transmittance within each region is uniform, i=1, . . . , N−1, N is a natural number and N>1. In some embodiments, materials of the 1st region to the Nth region are the same, and a thickness of the ith region is smaller than that of the (i+1)th region. In some other embodiments, a different color is painted in each of the 1st region to the Nth region.

According to some embodiments of the present disclosure, there is provided a manufacturing method of a mask comprising: providing a transparent substrate with a uniform transmittance; coating a compensation layer, a transmittance of which decreases gradually from an edge to a center, at one side of the transparent substrate; and forming a mask pattern at the other side of the transparent substrate.

In some embodiments of the present disclosure, a transmittance of the compensation layer decreasing gradually from the edge to the center is decreasing gradually from 100% to 70%.

In some embodiments of the present disclosure, the compensation layer is coated and formed in the following way: at the one side of the transparent substrate, from the edge to the center, a 1st region to a Nth region are coated in order, and an ith region surrounds an (i+1)th region, a transmittance of the ith region is higher than that of the (i+1)th region, a transmittance within each region is uniform, i=1, . . . , N−1, N is a natural number and N>1.

According to some embodiments of the present disclosure, there is also provided a display device, which includes spacers made by using the mask as described above.

BRIEF DESCRIPTION OF THE DRAWINGS

The drawings are used to provide further understanding of technical solutions of the present disclosure, and form a part

DETAILED DESCRIPTION

In order to make goals, technical solutions and advantages of the present disclosure more clear, embodiments of the present disclosure will be explained in detail in conjunction with drawings below. It is to be noted that, in a case where there is no conflict, embodiments in this application and features in embodiments may be combined with each other arbitrarily.

Steps shown in a flow chart of the drawings may be executed in a computer system with a set of computer executable instructions. In addition, although a logic order is shown in a flow chart, in certain circumstances, steps shown or described may be executed in an order different than the order herein.

Figure 1:
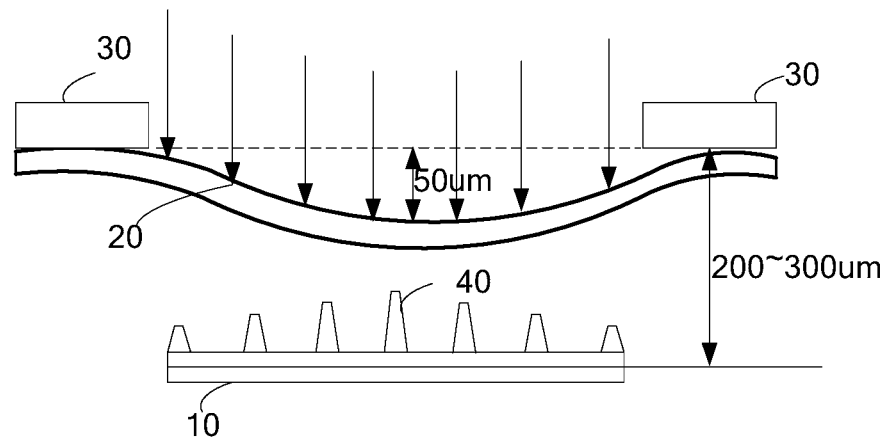
FIG. 1 is a schematic view of photo spacers obtained by exposure using a mask in the relevant art.

As shown in FIG. 1, in the proximity exposure process, a mask 20 is fixed by a mask holder 30, photo spacers 40 are obtained by performing exposure on a photoresist layer deposited on a color film substrate using the mask 20 and then performing development on the photoresist layer. Since the mask 20's own weight causes the mask to bend, the bend increases with the increase in the size of the mask. The physical bend of the mask leads to different gaps between the mask and an exposure machine worktable (for supporting a glass substrate). It may be seen from FIG. 1 that, the gap between the mask and the exposure machine worktable is usually 200~300 um. However, due to the bend, the gap between the central region and the exposure machine worktable is decreased by about 50 um, which is a big proportion. The gap has a big influence on the PS. Gaps are different, so that the PS heights are different, because the panel on the glass substrate 10 is at different locations of the mask. The bend causes the PS height at the exposed central region of the mask to be slightly high, and the PS height on the periphery to be slightly low, which presents a gradient distribution. It has been found in a real test that, the PS height at the center of the mask is higher than that on the periphery by about 0.1 um. Such non-uniform PS heights cause decrease in the process margin of the liquid crystal dropping amount. As a result, this results in bad reliance problems of high temperature yellowing, adsorption yellowing, too many bubbles, etc, which has a big influence on the quality of the product.

In some embodiments of the present disclosure, in order to overcome the problem that the mask bends due to its own weight so that exposure gaps are not uniform which causes heights of photo spacers formed by exposure to be not uniform, the transmittance of the mask is adjusted. The transmittance is used to compensate for the exposure gap, so that heights of photo spacers are more uniform. Since the exposure gap is the longest at the edge of the mask and the exposure gap is the shortest at the center and the exposure gap decreases gradually from the edge to the center, the transmittance is set in a way that the transmittance is the highest at the edge of the mask and the transmittance is the lowest at the center and the transmittance increases gradually from the edge to the center, so that this compensates for non-uniform heights of photo spacers caused by non-uniform exposure gaps, so as to make heights of photo spacers more uniform.

Some embodiments of the present disclosure provide a mask which includes a transmittable substrate. The transmittance of the transmittable substrate decreases gradually from the edge to the center. On one side of the transmittable substrate, a mask pattern is formed. Wherein, the transmittance refers to, a ratio of radiation energy irradiated and transmitted through an object to total radiation energy irradiated onto the object, in a process from incident light flux entering an irradiated surface or an incident surface of a medium to it exiting another surface. Different transmittances from the edge to the center of the transmittable substrate may be achieved by a plurality of methods. For example, the transmittable substrate may be painted different colors from the edge to the center, so that transmittances from the edge to the center are different; or, a two-layer structure is adopted, one layer is a transparent substrate with a uniform transmittance, the other layer is a compensation layer with transmittances decreasing gradually; or, the thickness of the transmittable substrate is changed, so that the transmittable substrate has different transmittances from the edge to the center, or, materials with different transmittances are adopted from the edge to the center, and so on.

Figure 2:
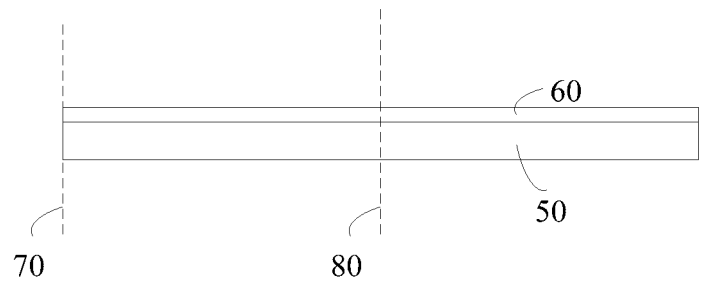
FIG. 2 is a structural diagram of a mask provided according to some embodiments of the present disclosure.

As shown in FIG. 2, some embodiments of the present disclosure provide a mask, the mask includes a transparent substrate 50 with a uniform transmittance as well as a compensation layer 60 covering the transparent substrate 50, the transmittance of the compensation layer 60 decreases gradually from an edge 70 to a center 80. Wherein, a mask pattern is at one side of the transparent substrate 50, the compensation layer 60 is at the other side of the transparent substrate 50 and is opposed to the mask pattern. It is to be noted that, the edge 70 refers to the edge of an active region of the mask, i.e. the edge of the region for exposure to form the photo spacers. The transmittance at a location outside the active region may be consistent with that at the edge of the active region, and may also not be consistent with that at the edge of the active region. The material of the transparent substrate 50 may include quartz, but not limited thereto.

Figure 3:
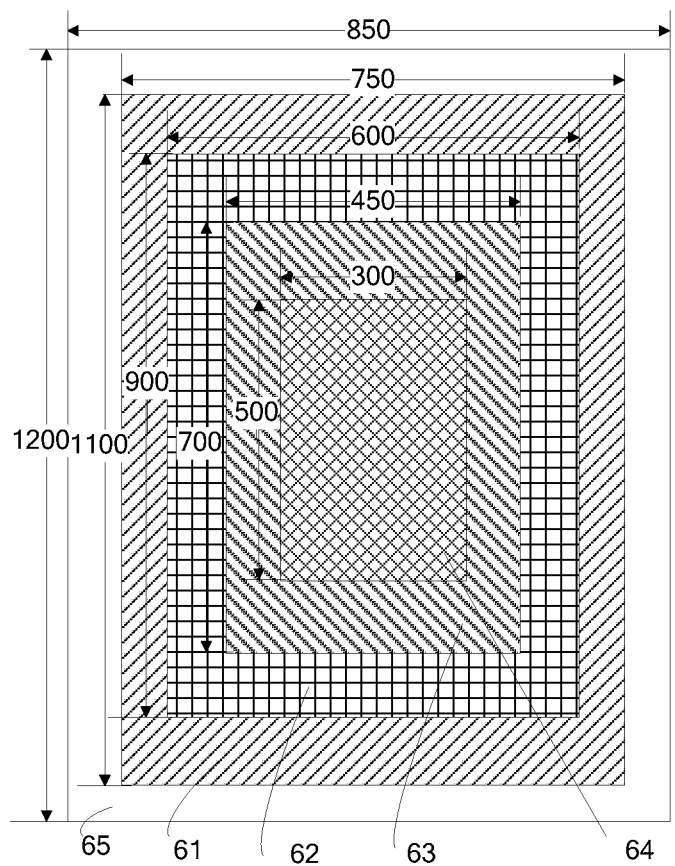
FIG. 3 is a schematic view of a mask provided according to some other embodiments of the present disclosure.

With respect to the transmittance of the compensation layer 60 decreasing gradually from the edge to the center, the compensation layer 60 may be divided into a plurality of regions from the edge to the center. The region close to the edge surrounds the region close to the center, and the transmittance of the region close to the edge is lower than that of the region close to the center, the transmittance within a same region is uniform. An exemplary dividing method is as shown in FIG. 3. From the edge to the center, a first region 61, a second region 62, a third region 63 and a fourth region 64 are included in order, the transmittance within a same region is uniform. The transmittance of the first region 61 is higher than that of the second region 62, the transmittance of the second region 62 is higher than that of the third region 63, the transmittance of the third region 63 is higher than that of the fourth region 64. A region 65 shown in FIG. 3 is a non-active region, i.e. a region which does not participate in the exposure. The transmittance of the region 65 is not limited, it may be consistent with the transmittance of the first region 61, and may also not be consistent with the transmittance of the first region 61. As shown in FIG. 3, when the size of the mask is 1200*850, one example of dividing respective regions is that: the fourth region 64 is a rectangular region of 500*300 at the center, the third region 63 is a region in a rectangular region of 700*450 excluding the fourth region 64, the second region 62 is a region in a rectangular region of 900*600 excluding the third region 63 and the fourth region 64, the first region 61 is a region in a rectangular region of 1100*750 excluding the second region 62, the third region 63 and the fourth region 64. It is to be noted that, the method of dividing the regions, as shown in FIG. 3, is only one example. In fact, it may be divided into fewer regions, e.g. divided into three regions, or, divided into more regions. For example, the compensation layer 60 includes a 1st region to a Nth region from the edge to the center, and an ith region surrounds an (i+1)th region, the transmittance of the ith region is higher than that of the (i+1)th region, the transmittance within each region is uniform, i=1, ... , N−1, N is a natural number and N>1. In addition, the shape of the region may also be changed, for instance, it may be a circle or an ellipse or an irregular shape, etc, the sizes of respective regions may also be determined.

In some embodiments of the present disclosure, the compensation layer 60 is made of a material with high surface flatness, high transmittance, high electrostatic conduction, e.g. a film made of a polymer material. The polymer material includes at least one of PP (polypropylene)/PVC (polyvinyl chloride)/PE (polyethylene)/PET (polyethylene terephthalate), etc. These are only examples, other polymer materials may also be used to make the compensation layer 60.

In some embodiments of the present disclosure, in order to achieve the transmittance decreasing gradually from the edge to the center, the compensation layer 60 may be made of the same material, but its thickness increases gradually from the center to the edge, so that the purpose of the transmittance decreasing gradually is achieved. Taking FIG. 3 as an example, the first region 61 of the compensation layer 60 may not be covered by a film, the second region 62 is covered by a layer of a film, the third region 63 is covered by a layer of a film, the thickness of which is larger than that of the second region 62, the fourth region 64 is covered by a layer of a film, the thickness of which is larger than that of the third region. Since the material is the same, when the thickness increases, the transmittance decreases gradually, so that the purpose of the transmittance decreasing gradually from the edge to the center is achieved.

In some embodiments of the present disclosure, in order to achieve the transmittance decreasing gradually from the edge to the center, the compensation layer 60 may also be made of materials which have the same thickness but different transmittances. Taking FIG. 3 as an example, the first region 61 may not be covered by a film, the second region 62, the third region 63 and the fourth region 64 are covered by films made of different materials respectively, and the transmittances of the materials of respective regions satisfy that: the second region 62>the third region 63>the fourth region 64.

Of course, the above mentioned two methods may also be combined, the material and the thickness are combined to achieve the transmittance decreasing gradually from the edge to the center. In addition, in the above mentioned embodiment, the first region 61 is not covered by a layer of a film. In other embodiments of the present application, the first region 61 may also be covered by a layer of a film, and correspondingly, the second region 62 is covered by a layer of a film, the thickness of which is larger than that of the first region 61, the third region 63 is covered by a layer of a film, the thickness of which is larger than that of the second region 62, the fourth region 64 is covered by a layer of a film, the thickness of which is larger than that of the third region 63, so that the transmittances satisfy that: the first region 61>the second region 62>the third region 63>the fourth region 64.

In some embodiments, the change of the transmittance may also be achieved by painting different colors in each of the 1st region to the Nth region. Take FIG. 3 as an example, different colors with different transmittances may be painted on different regions so that the transmittances satisfy that: the first region 61>the second region 62>the third region 63>the fourth region 64.

In some embodiments of the present disclosure, when the transmittance of the compensation layer 60 decreases gradually from the edge to the center, the magnitude of the gradual decrease is adjusted according to the magnitude of the change of the exposure gap between the mask and the exposure machine worktable from the edge to the center. Because the transmittance is compensation for the exposure gap, the longer the exposure gap is, the higher the transmittance is, the shorter the exposure gap is, the lower the transmittance is, the magnitude of the gradual decrease of the transmittance may be modulated according to the magnitude of the change of the exposure gap. Therefore, the transmittance of the compensation layer 60 may be set according to different exposure gaps caused by the degree of the bend. It may be ascertained via a test that, when the maximum bend of the central region is 50 um, it causes a difference value of about 0.15 um between PS heights at the center and the edge. It may be ascertained via a real test that, when the transmittances at the edge and the center are set to be 100% and 70% respectively, the PS heights at the center and the edge are relatively uniform. Therefore, the transmittance decreasing gradually from the edge to the center may be set to be decreasing gradually from 100% to 70%. Taking FIG. 3 as an example, the transmittance of the first region 61 may be set to be 100%, the transmittance of the fourth region 64 may be set to be 70%. At this time, the PS heights at the center and the edge are substantially uniform. The transmittances of other regions may be set according to the degrees of the bend of the mask in those regions. In a practical application, different transmittances may be set in respective regions for test, so that the PS heights obtained by exposure in respective regions are substantially uniform. In one optional embodiment of the present disclosure, the transmittance of the second region 62 may be set to be 90%, the transmittance of the third region 63 may be set to be 80%. Of course, the above mentioned numerical values of the transmittance are only examples, the transmittance may be set to be other values, so that the PS heights are more uniform. In addition, when the size and the weight of the mask are changed which results in the change of the degree of the bend of the mask, the transmittances of respective regions are to be changed correspondingly. Specifically, it is possible to obtain transmittances which make the PS heights more uniform. Or, it is also possible to calculate a relationship between the transmittance, the exposure gap and the PS height first, determine the transmittances according to the relationship, then take a test, adjust the transmittances of respective regions according to the test result. Of course, this may also be simplified, the transmittance may be directly set to decrease gradually evenly from the edge to the center.

In some embodiments of the present disclosure, by changing the transmittance of the transmittable substrate of the mask, the transmittance is caused to decrease gradually from the edge to the center, so that it compensates for the gradual decrease of the exposure gap from the edge to the center caused by the bend of the mask resulting from the mask's own weight, so that the shapes of the photo spacers obtained by performing exposure using the mask are more uniform, the quality of the liquid crystal panel is improved.

Although the embodiment described with reference to FIG. 3 is described with respect to the division of the compensation layer 60, the embodiment of the present disclosure is not limited thereto. For example, the division of the regions described with respect to FIG. 3 may be done directly with respect to the transmittable substrate. For example, similarly, the transmittable substrate includes a 1st region to a Nth region from the edge to the center, and an ith region surrounds an (i+1)th region, the transmittance of the ith region is higher than that of the (i+1)th region, the transmittance within each region is uniform, i=1, . . . , N−1, N is a natural number and N>1.

Based on the similar region division of the transmittable substrate, the different transmittances from the edge to the center are achieved e.g. by painting different colors in different regions of the transmittable substrate. For example, in some embodiments, different colors are painted in each of the 1st region to the Nth region.

Based on the similar region division of the transmittable substrate, the different transmittances from the edge to the center are achieved e.g. by achieving different thicknesses in different regions of the transmittable substrate. For example, in some embodiments, the materials of the 1st region to the Nth region are the same, and the thickness of the ith region is smaller than that of the (i+1)th region.

All of other alternative embodiments that those skilled in the art can think of based on teaching of the present disclosure fall into the protection scope of the present disclosure.

Figure 4:
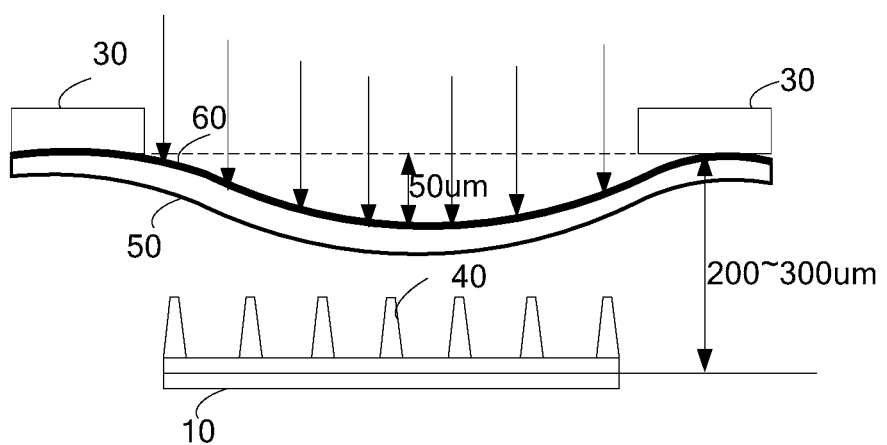
FIG. 4 is a schematic view of photo spacers obtained by performing exposure after applying a mask provided according to some embodiments of the present disclosure.

As shown in FIG. 4, it is a schematic view of performing exposure using a mask provided by some embodiments of the present disclosure. After adopting the mask provided by some embodiments of the present disclosure, since the transmittance decreases gradually from the edge to the center, though the exposure gap of the edge is big, the transmittance of the edge is high, more light is transmitted, which compensates for the exposure, whereas though the exposure gap of the center is small, the transmittance thereof is low. Therefore, the difference of the PS heights obtained by exposure at the edge and the center is decreased, which enhances the uniformity of the PS heights.

Some embodiments of the present disclosure also provide a manufacturing method of a mask, which includes: providing a transparent substrate with a uniform transmittance; coating a compensation layer, the transmittance of which decreases gradually from an edge to a center, at one side of the transparent substrate; and forming a mask pattern at the other side of the transparent substrate.

In some embodiments of the present disclosure, the transmittance of the compensation layer decreasing gradually from the edge to the center is decreasing gradually from 100% to 70%.

In some embodiments of the present disclosure, the compensation layer is coated and formed in the following way: at one side of the transparent substrate, from the edge to the center, a 1st region to a Nth region are coated in order, and an ith region surrounds an (i+1) th region, the transmittance of the ith region is higher than that of the (i+1) th region, the transmittance within each region is uniform, i=1, . . . , N−1, N is a natural number and N>1.

It is to be noted that, the above mentioned mask is not limited to being used for exposure on the PS. It is also applicable to other cases where a mask is to be used for exposure in order to generate a pattern. The transmittance may be changed correspondingly with the pattern.

According to some embodiments of the present disclosure, there is also provided a display device, which includes spacers made by using the mask as described above. Those skilled in the art may understand that, the heights of the spacers made by adopting the mask as described above are relatively uniform. The display device may be, but not limited to, any product or component which has a display function, such as a liquid crystal display panel, electronic paper, a cellphone, a tablet computer, a TV set, a display, a notebook computer, a digital photo frame, a navigator, etc.

Although embodiments disclosed by the present disclosure are as described above, the described content is only embodiments adopted for easy understanding of the present disclosure, but not to limit the present disclosure. Any of those skilled in the art to which the present disclosure belongs, without departing the spirit and the scope disclosed by the present disclosure, may make any modifications and changes in form and detail to embodiments. However, the patent protection scope of the present disclosure still has to conform to the scope as defined by appended claims.

What is claimed is:

1. A mask, comprising a transmittable substrate and a mask pattern formed on the transmittable substrate, wherein a transmittance of the transmittable substrate decreases gradually from an edge to a center,
wherein the transmittable substrate comprises a transparent substrate with a uniform transmittance and a compensation layer coated on the transparent substrate, a transmittance of the compensation layer decreases gradually from the edge to the center, and the mask pattern is formed at one side of the transparent substrate, the compensation layer is coated on the other side of the transparent substrate, and
wherein a material of the compensation layer comprises at least one of polypropylene, polyethylene, polyvinyl chloride, or polyethylene terephthalate.

2. The mask according to claim 1, wherein the transmittance decreasing gradually from the edge to the center is decreasing gradually from 100% to 70%.

3. The mask according to claim 1, wherein when the transmittance decreases gradually from the edge to the center, a magnitude of gradual decrease is adjusted according to a magnitude of change of an exposure gap between the mask and an exposure machine worktable from the edge to the center.

4. The mask according to claim 1, wherein the compensation layer comprises a 1st region to a Nth region from the edge to the center, and an ith region surrounds an (i+1)th region, a transmittance of the ith region is higher than that of the (i+1)th region, a transmittance within each region is uniform, i=1, . . . , N−1, N is a natural number and N>1.

5. The mask according to claim 4, wherein materials of the 1st region to the Nth region are the same, and a thickness of the ith region is smaller than that of the (i+1)th region.

6. The mask according to claim 4, wherein a color is painted in each of the 1st region to the Nth region.

7. The mask according to claim 1, wherein the transmittable substrate comprises a 1st region to a Nth region from the edge to the center, and an ith region surrounds an (i+1)th region, a transmittance of the ith region is higher than that of the (i+1)th region, a transmittance within each region is uniform, i=1, . . . , N−1, N is a natural number and N>1.

8. The mask according to claim 7, wherein materials of the 1st region to the Nth region are the same, and a thickness of the ith region is smaller than that of the (i+1)th region.

9. The mask according to claim 7, wherein a different color is painted in each of the 1st region to the Nth region.

10. A manufacturing method of a mask comprising:
providing a transparent substrate with a uniform transmittance;
coating a compensation layer, a transmittance of which decreases gradually from an edge to a center, at one side of the transparent substrate; and
forming a mask pattern at the other side of the transparent substrate,
wherein a material of the compensation layer comprises at least one of polypropylene, polyethylene, polyvinyl chloride, or polyethylene terephthalate.

11. The manufacturing method according to claim 10, wherein a transmittance of the compensation layer decreasing gradually from the edge to the center is decreasing gradually from 100% to 70%.

12. The manufacturing method according to claim 11, wherein the compensation layer is coated and formed in the following way: at the one side of the transparent substrate, from the edge to the center, a 1st region to a Nth region are coated in order, and an ith region surrounds an (i+1)th region, a transmittance of the ith region is higher than that of the (i+1)th region, a transmittance within each region is uniform, i=1, . . . , N−1, N is a natural number and N>1.

13. The manufacturing method according to claim 10, wherein the compensation layer is coated and formed in the following way: at the one side of the transparent substrate, from the edge to the center, a 1st region to a Nth region are coated in order, and an ith region surrounds an (i+1)th region, a transmittance of the ith region is higher than that of the (i+1)th region, a transmittance within each region is uniform, i=1, . . . , N−1, N is a natural number and N>1.

\* \* \* \* \*